United States Patent
Liang et al.

(10) Patent No.: US 6,740,567 B2
(45) Date of Patent: May 25, 2004

(54) LAMINATING METHOD FOR FORMING INTEGRATED CIRCUIT MICROELECTRONIC FABRICATION

(75) Inventors: Mong-Song Liang, Hsin-Chu (TW); Syun-Ming Jang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/885,784

(22) Filed: Jun. 20, 2001

(65) Prior Publication Data

US 2002/0197775 A1 Dec. 26, 2002

(51) Int. Cl.[7] .......................... H01L 21/30; H01L 21/46
(52) U.S. Cl. ...................... 438/459; 438/119; 438/458; 438/977; 438/692
(58) Field of Search ................ 438/458, 977, 438/692, 107, 110, 141, 196, 197, 210, 381, 455, 459, 584, 597, 598, 602, 606, 612, 618, 620, 626, 628, 629, 631, 634, 637, 660, 661, 635, 761, 778; 257/256, 594, 750, 753, 779

(56) References Cited

U.S. PATENT DOCUMENTS

| | | | | |
|---|---|---|---|---|
| 5,514,613 A | * | 5/1996 | Santadrea et al. ............. | 438/15 |
| 5,880,010 A | * | 3/1999 | Davidson .................... | 438/455 |
| 5,946,559 A | | 8/1999 | Leedy ......................... | 438/157 |
| 6,013,534 A | * | 1/2000 | Mountain .................... | 438/15 |
| 6,066,808 A | * | 5/2000 | Kresge et al. ............... | 174/262 |
| 6,143,117 A | * | 11/2000 | Kelly et al. .................. | 156/233 |
| 6,245,677 B1 | * | 6/2001 | Haq ........................... | 438/690 |
| 6,309,945 B1 | * | 10/2001 | Sato et al. ................... | 438/409 |

* cited by examiner

Primary Examiner—George Fourson
Assistant Examiner—Julio J. Maldonado
(74) Attorney, Agent, or Firm—Tung & Associates

(57) ABSTRACT

Within a method for fabricating a semiconductor integrated circuit microelectronic fabrication there is first provided a first semiconductor substrate. There is then formed over the first semiconductor substrate at least one microelectronic device to form from the first semiconductor substrate a partially fabricated semiconductor integrated circuit microelectronic fabrication. Within the method there is also provided a second substrate. There is also formed over the second substrate, in inverted order, a dielectric isolated metallization pattern intended to mate with the partially fabricated semiconductor integrated circuit microelectronic fabrication. Finally, there is then laminated the partially fabricated semiconductor integrated circuit microelectronic fabrication with the second substrate to mate the partially fabricated semiconductor integrated circuit microelectronic fabrication with the dielectric isolated metallization pattern to thus form a laminated completely fabricated semiconductor integrated circuit microelectronic fabrication. The method provides for enhanced efficiency when fabricating semiconductor integrated circuit microelectronic fabrications.

10 Claims, 2 Drawing Sheets

LAMINATING METHOD FOR FORMING INTEGRATED CIRCUIT MICROELECTRONIC FABRICATION

BACKGROUND OF THE INVENTION

1. Field of the Invention

The present invention relates generally to methods for fabricating integrated circuit microelectronic fabrications. More particularly, the present invention relates to methods for efficiently fabricating integrated circuit microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication functionality levels have increased and microelectronic fabrication integration levels have increased, so also has the complexity of microelectronic fabrication facilities and microelectronic fabrication processes which are employed for fabricating microelectronic fabrications. Similarly, as a result of enhanced complexity of microelectronic fabrication facilities and microelectronic fabrication processes which are employed for fabricating microelectronic fabrications, there is typically also encountered extended microelectronic fabrication process times when fabricating advanced microelectronic fabrications.

While extended microelectronic fabrication process times are often unavoidable when fabricating advanced microelectronic fabrications, extended microelectronic fabrication process times are nonetheless clearly not desirable in the art of microelectronic fabrication insofar as extended microelectronic fabrication process times often in turn provide for inefficient microelectronic fabrication facility and tooling utilization, which further in turn provides for non-optimal microelectronic fabrication facility return on investment and non-optimal microelectronic fabrication tooling return on investment.

It is thus desirable in the art of microelectronic fabrication to provide methods and materials through which microelectronic fabrications may be more efficiently fabricated within microelectronic fabrication facilities.

It is towards the foregoing object that the present invention is directed.

Various methods and materials have been disclosed in the art of microelectronic fabrication for efficiently fabricating microelectronic fabrications with desirable properties in the art of microelectronic fabrication.

For example, Leedy, in U.S. Pat. No. 5,946,559, discloses a general method for fabricating, with enhanced process flexibility, various microelectronic structures and microelectronic layers when fabricating microelectronic fabrications. To realize the foregoing object, the method employs fabricating and connecting flexible free standing membranes formed of at least microelectronic dielectric materials and microelectronic semiconductor materials, wherein the flexible free standing membranes have formed therein microelectronic structures and microelectronic layers which are desirable when fabricating microelectronic fabrications.

Desirable in the art of microelectronic fabrication are additional methods and materials through which microelectronic fabrications may be more efficiently fabricated within microelectronic fabrication facilities.

It is towards the foregoing object that the present invention is directed.

SUMMARY OF THE INVENTION

A first object of the present invention is to provide a method for fabricating a microelectronic fabrication.

A second object of the present invention is to provide a method in accord with the first object of the present invention, wherein the microelectronic fabrication is fabricated efficiently.

A third object of the present invention is to provide a method in accord with the first object of the present invention and the second object of the present invention, wherein the method is readily commercially implemented.

In accord with the objects of the present invention, there is provided by the present invention a method for fabricating a semiconductor integrated circuit microelectronic fabrication. To practice the method of the present invention, there is first provided a first semiconductor substrate. There is then formed over the first semiconductor substrate at least one microelectronic device to form from the first semiconductor substrate a partially fabricated semiconductor integrated circuit microelectronic fabrication. Within the present invention, there is also provided a second substrate. There is also formed over the second substrate, in inverted order, a dielectric isolated metallization pattern intended to mate with the partially fabricated semiconductor integrated circuit microelectronic fabrication. Finally, there is then laminated the partially fabricated semiconductor integrated circuit microelectronic fabrication with the second substrate to mate the partially fabricated semiconductor integrated circuit microelectronic fabrication with the dielectric isolated metallization pattern to thus form a laminated completely fabricated semiconductor integrated circuit microelectronic fabrication.

There is provided by the present invention a method for fabricating a microelectronic fabrication, wherein the microelectronic fabrication is fabricated efficiently. The present invention realizes the foregoing object by employing when fabricating a semiconductor integrated circuit microelectronic fabrication a partially fabricated semiconductor integrated circuit microelectronic fabrication formed from a first semiconductor substrate having a minimum of one semiconductor device fabricated thereover, wherein the partially fabricated semiconductor integrated circuit microelectronic fabrication is laminated with a second substrate having formed thereover a dielectric isolated metallization pattern to mate the dielectric isolated metallization pattern with the partially fabricated semiconductor integrated circuit microelectronic fabrication. By employing within the context of the present invention a first semiconductor substrate and a separate second substrate, each partially fabricated with respect to a semiconductor integrated circuit microelectronic fabrication, and laminating the first semiconductor substrate and the second substrate to provide a laminated completely fabricated semiconductor integrated circuit microelectronic fabrication, the laminated completely fabricated semiconductor integrated circuit microelectronic fabrication may be formed with enhanced efficiency since at least two separate portions of the laminated completely fabricated semiconductor integrated circuit microelectronic fabrication may be fabricated in parallel.

The method of the present invention is readily commercially implemented. The present invention employs methods and materials, which although not necessarily common in the art of microelectronic fabrication are nonetheless readily adapted to the art of microelectronic fabrication. Since it is thus a specific ordering of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, wherein.

DESCRIPTION OF THE PREFERRED EMBODIMENT

Figure 1:
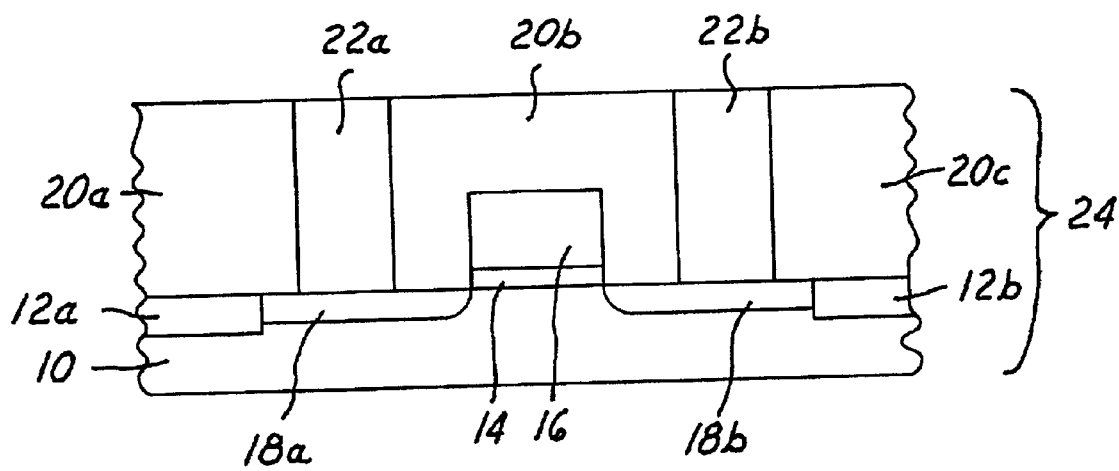
FIG. 1, FIG. 2, FIG. 3 and FIG. 4 show a series of schematic cross-sectional diagrams illustrating the results of progressive stages in forming, in accord with a preferred embodiment of the present invention, a semiconductor integrated circuit microelectronic fabrication.

There is provided by the present invention a method for fabricating a microelectronic fabrication, wherein the microelectronic fabrication is fabricated efficiently. The present invention realizes the foregoing object by employing when fabricating a semiconductor integrated circuit microelectronic fabrication a partially fabricated semiconductor integrated circuit microelectronic fabrication formed from a first semiconductor substrate having a minimum of one semiconductor device fabricated thereover, wherein the partially fabricated semiconductor integrated circuit microelectronic fabrication is laminated with a second substrate having formed thereover a dielectric isolated metallization pattern to mate the dielectric isolated metallization pattern with the partially fabricated semiconductor integrated circuit microelectronic fabrication. By employing within the context of the present invention a first semiconductor substrate and a separate second substrate, each partially fabricated with respect to a semiconductor integrated circuit microelectronic fabrication, and laminating the first semiconductor substrate and the second substrate to provide a laminated completely fabricated semiconductor integrated circuit microelectronic fabrication, the laminated completely fabricated semiconductor integrated circuit microelectronic fabrication may be formed with enhanced efficiency since at least two separate portions of the laminated completely fabricated semiconductor integrated circuit microelectronic fabrication may be fabricated in parallel.

Although the preferred embodiment of the present invention illustrates the present invention most specifically within the context of a semiconductor integrated circuit microelectronic fabrication having formed therein a field effect transistor (FET) as a semiconductor integrated circuit microelectronic fabrication device, the present invention may also be employed when fabricating semiconductor integrated circuit microelectronic fabrications having formed therein semiconductor integrated circuit microelectronic fabrication devices including but not limited to resistors, transistors, diodes and capacitors.

Similarly, although the preferred embodiment of the present invention illustrates the present invention within the context a single partially fabricated semiconductor integrated circuit microelectronic fabrication laminated with a single second substrate having formed thereover a single dielectric isolated metallization pattern to form upon mating of the single partially fabricated semiconductor integrated circuit microelectronic fabrication with the single dielectric isolated metallization pattern a laminated completely fabricated semiconductor integrated circuit microelectronic fabrication, the method of the present invention may employ multiple sequential laminations of additional substrates (providing prior substrates are removed) and matings of additional dielectric isolated metallization patterns when forming a laminated completely fabricated semiconductor integrated circuit microelectronic fabrication.

Referring now to FIG. 1 to FIG. 4, there is shown a series of schematic cross-sectional diagrams illustrating the results of progressive stages in forming, in accord with a preferred embodiment of the present invention, a semiconductor integrated circuit microelectronic fabrication.

Shown in FIG. 1 is a schematic cross-sectional diagram of a first portion of the semiconductor integrated circuit microelectronic fabrication at an early stage in its fabrication in accord with the preferred embodiment of the present invention.

Shown in FIG. 1, in a first instance, is a first semiconductor substrate 10 having formed therein a pair of shallow trench isolation regions 12a and 12b which define an active region of the first semiconductor substrate 10.

Within the preferred embodiment of the present invention with respect to the first semiconductor substrate 10, the first semiconductor substrate 10 may be formed from any of several semiconductor materials as are conventional in the art of semiconductor integrated circuit microelectronic fabrication, including but not limited to silicon semiconductor materials and compound semiconductor materials, such as but not limited to gallium arsenide compound semiconductor materials. More typically and preferably, the first semiconductor substrate 10 is formed from a (100) silicon semiconductor material.

Within the preferred embodiment of the present invention with respect to the pair of shallow trench isolation regions 12a and 12b, the pair of shallow trench isolation regions 12a and 12b is typically and preferably formed employing methods as are similarly conventional in the art of semiconductor integrated circuit microelectronic fabrication, such methods including but not limited to isolation region deposition methods and isolation region thermal growth methods.

Shown also within the schematic cross-sectional diagram of FIG. 1 formed within and upon the active region of the first semiconductor substrate 10 as defined by the shallow trench isolation regions 12a and 12b is a series of structures which comprises a field effect transistor (FET). The series of structures which comprises the field effect transistor (FET) comprises a gate dielectric layer 14 formed upon the active region of the first semiconductor substrate 10, a gate electrode 16 formed aligned upon the gate dielectric layer 14 and a pair of source/drain regions 18a and 18b formed within the active region of the first semiconductor substrate 10 at portions not covered by the gate dielectric layer 14 and the gate electrode 16.

Each of the foregoing series of structures which comprises the field effect transistor (FET) may be formed employing methods and materials as are otherwise conventional in the art of semiconductor integrated circuit microelectronic fabrication.

For example, the gate dielectric layer 14 is typically and preferably formed of a silicon containing gate dielectric material, such as but not limited to a silicon oxide gate dielectric material, a silicon nitride gate dielectric material or a silicon oxynitride gate dielectric material, formed to a thickness of from about 10 to about 20 angstroms upon the active region of the first semiconductor substrate 10. In addition, the gate electrode 16 is typically and preferably formed of a gate electrode material selected from the group consisting of metal, metal alloy, doped polysilicon (having a dopant concentration greater than about 1021 dopant atoms per cubic centimeters) and polycide (doped polysilicon/metal silicide stack) gate electrode materials, formed aligned upon the gate dielectric layer 14 to a thickness of from about 300 to about 600 angstroms. Finally, the pair of source/drain regions 18a and 18b is typically and preferably formed within the active region of the first semiconductor substrate 10 at areas not covered by the gate dielectric layer 14 and the gate electrode 16 while employing an ion implantation method employing an appropriate dopant ion at an ion implantation dose of from about $10^{14}$ to about $10^{15}$ atoms per square centimeter and an ion implantation energy of from about 0.5 to about 1 Kev.

Shown also within the schematic cross-sectional diagram of FIG. 1 formed passivating in part the series of structures which comprises the field effect transistor (FET) is a series of patterned planarized pre-metal dielectric layers 20a, 20b and 20c which in turn define a pair of vias into which are formed a pair of conductor contact studs 22a and 22b.

Within the preferred embodiment of the present invention with respect to the series of patterned planarized pre-metal dielectric layers 20a, 20b and 20c, the series of patterned planarized pre-metal dielectric layer 20a, 20b and 20c may be formed employing methods as are conventional in the art of microelectronic fabrication to typically and preferably provide the series of patterned planarized pre-metal dielectric (PMD) layers 20a, 20b and 20c formed of dielectric materials including but not limited to silicon oxide dielectric materials, silicon nitride dielectric materials and silicon oxynitride dielectric materials. Typically and preferably, each of the series of patterned planarized pre-metal dielectric (PMD) layers 20a, 20b and 20c is formed to a thickness of from about 5000 to about 7000 angstroms.

Finally, within the preferred embodiment of the present invention with respect to the pair of conductor contact studs 22a and 22b, the pair of conductor contact studs 22a and 22b may be formed of conductor materials as are conventional in the art of microelectronic fabrication, including but not limited to metal, metal alloy, doped polysilicon and polycide conductor stud materials. However, as is understood by a person skilled in the art, it is preferred within the context of the present invention that the pair of conductor contact studs 22a and 22b is formed of a conductor material, and of dimension., such as to facilitate within the context of the present invention bonding of the pair of conductor contact studs 22a and 22b with a pair of patterned conductor layers within a dielectric isolated metallization pattern subsequently laminated thereto. Thus, at least an upper portion of the conductor contact studs 22a and 22b may be formed of a thermally bondable metal (i.e., a solder) or a pressure bondable metal (for example and without limitation an indium or an indium alloy pressure bondable material), or may protrude from above the plane of the patterned planarized pre-metal dielectric layers 20a, 20b and 20c in order to facilitate bonding.

Finally, with respect to the semiconductor integrated circuit microelectronic fabrication whose schematic cross-sectional diagram is illustrated in FIG. 1, as is understood by a person skilled in the art, the semiconductor integrated circuit microelectronic fabrication whose schematic cross-sectional diagram is illustrated in FIG. 1 is illustrated as a partially fabricated semiconductor integrated circuit microelectronic fabrication 24, insofar as it is desirable to fabricate upon the semiconductor integrated circuit microelectronic fabrication whose schematic cross-sectional diagram is illustrated in FIG. 1 a dielectric isolated metallization pattern at least in part to provide a completely fabricated semiconductor integrated circuit microelectronic fabrication.

Also notable with respect to the present invention is that there is typically and preferably not employed any thinning of the semiconductor substrate 10 within the partially fabricated semiconductor integrated circuit microelectronic fabrication 24 after having formed thereupon the series of structures which comprises the field effect transistor (FET). Such thinning may otherwise be effected employing etching methods, milling methods or polishing methods as are otherwise conventional in the art of semiconductor integrated circuit microelectronic fabrication.

Figure 2:
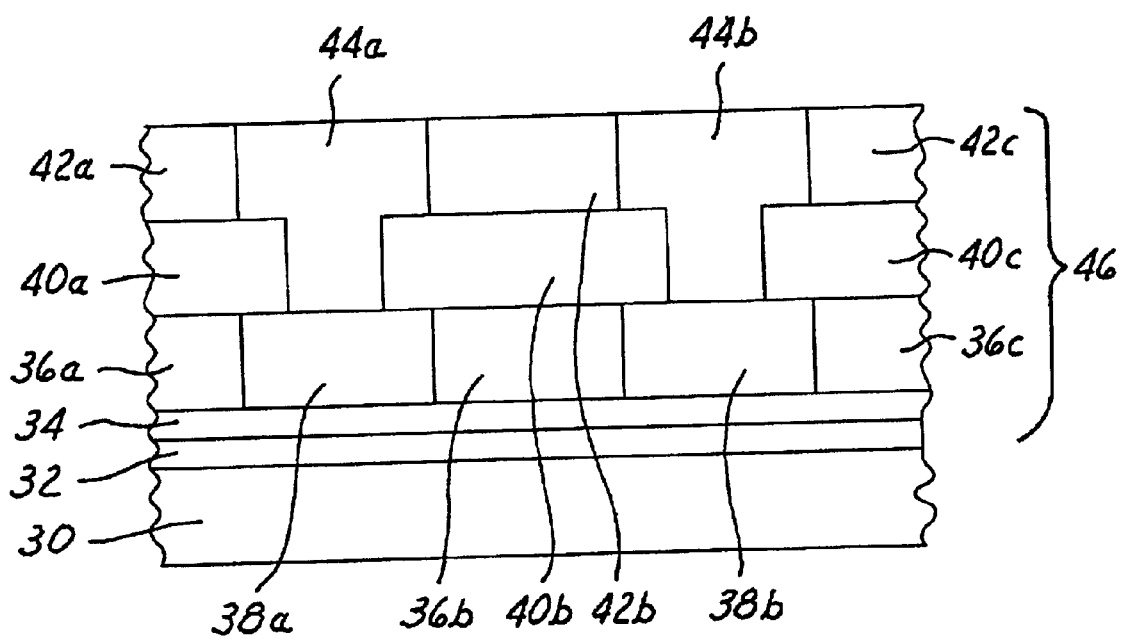

Referring now to FIG. 2, there is shown an additional schematic cross-sectional diagram of a second substrate having formed thereover several layers which are further employed when fabricating a semiconductor integrated circuit microelectronic fabrication in accord with the preferred embodiment of the present invention.

Within the preferred embodiment of the present invention, the second substrate is illustrated as a second substrate 30 within the schematic cross-sectional diagram of FIG. 2.

Within the preferred embodiment of the present invention with respect to the second substrate 30, the second substrate 30 may be a semiconductor substrate, such as but not limited to a silicon semiconductor substrate otherwise generally analogous or equivalent to the first semiconductor substrate 10 as illustrated within the schematic cross-sectional diagram of FIG. 1. In the alternative, the second substrate 30 may consist of or comprise a substrate formed of a material alternative to or in addition to a semiconductor material, wherein such a materials may be selected from the group including but not limited to conductor materials, semiconductor materials, dielectric materials and aggregates thereof. Similarly, and for reasons which follow, the second substrate 30 may be either thinner or thicker than the first semiconductor substrate 10, but typically and preferably thinner than the first semiconductor substrate 10. Typically and preferably, the second substrate 30 is formed to a thickness of from about 800 to about 1000 microns while the semiconductor substrate is formed to a thickness of from about 800 to about 1000 microns.

Shown also within the schematic cross-sectional diagram of FIG. 2 formed over the second substrate 30 is a dielectric isolated metallization pattern 46 comprising: (1) a blanket terminal passivation layer 32 formed upon the second substrate 30; (2) a blanket underlying passivation layer 34 formed upon the blanket terminal passivation layer 32; (3) a pair of patterned terminal conductor layers 38a and 38b separated by a series of patterned terminal dielectric layers 36a, 36b and 36c all of which are formed upon the blanket underlying passivation layer 34; and (4) a pair of contiguous patterned conductor interconnect and patterned conductor stud layers 44a and 44b separated by a series of patterned second inter-metal dielectric layers 40a, 40b and 40c having formed thereupon a series of patterned first inter-metal dielectric layers 42a, 42b and 42c, wherein the pair of contiguous patterned conductor interconnect and patterned conductor stud layers 44a and 44b contacts the pair of patterned terminal conductor layers 38a and 38b. As is understood by a person skilled in the art, the dielectric isolated metallization pattern 46 as illustrated within the schematic cross-sectional diagram of FIG. 2 is intended to mate with the partially fabricated semiconductor integrated circuit microelectronic fabrication 24 as illustrated within the schematic cross-sectional diagram of FIG. 1 and thus the dielectric isolated metallization pattern 46 is fabricated with an inverted ordering of dielectric layers and metallization layers formed therein.

Within the preferred embodiment of the present invention with respect to the pair of patterned terminal conductor layers 38a and 38b, and the pair of contiguous patterned conductor interconnect and patterned conductor stud layers 44a and 44b, the pair of patterned terminal conductor layers 38a and 38b, and the pair of contiguous patterned conductor interconnect and patterned conductor stud layers 44a and 44b, may be formed of conductor materials as are conventional in the art of microelectronic fabrication, which will typically and preferably include metal and metal alloy conductor materials. Typically and preferably the pair of patterned terminal conductor layers 38a and 38b is formed to a thickness of from about 3000 to about 6000 angstroms, while the pair of patterned contiguous conductor interconnect and patterned conductor stud layers 44a and 44b is formed to a thickness of from about 3000 to about 6000 angstroms, typically and preferably while employing a dual damascene chemical mechanical polish (CMP) planarizing method. Analogously with the pair of conductor contact studs 22a and 22b, the pair of contiguous patterned conductor interconnect and patterned conductor stud layers 44a and 44b may be fabricated with specific materials considerations or specific dimensional considerations as noted above with respect to the pair of conductor contact studs 22a and 22b, such as to effect optimal bonding upon mating with the pair of conductor contact studs 22a and 22b.

Within the preferred embodiment of the present invention with respect to the blanket terminal passivation layer 32, the blanket underlying passivation layer 34, the patterned terminal dielectric layers 36a, 36b and 36c, the patterned second intermetal dielectric (IMD) layers 40a, 40b and 40c and the patterned first inter-metal dielectric (IMD) layers 42a, 42b and 42c, each of the blanket terminal passivation layer 32, the blanket underlying passivation layer 34, the patterned terminal dielectric layers 36a, 36b and 36c, the patterned second inter-metal dielectric (IMD) layers 40a, 40b and 40c and the patterned first inter-metal dielectric (IMD) layers 42a, 42b and 42c may be formed employing methods and materials as are conventionally employed for forming those layers within semiconductor integrated circuit microelectronic fabrications, such methods including but not limited to chemical vapor deposition (CVD) methods, plasma enhanced chemical vapor deposition (PECVD) methods, physical vapor deposition (PVD) sputtering methods and spin-on methods through which may be formed dielectric layers of dielectric materials including but not limited to silicon oxide dielectric materials, silicon nitride dielectric materials, silicon oxynitride dielectric materials, spin-on-glass (SOG) dielectric materials and spin-on-polymer (SOP) dielectric materials.

Within the preferred embodiment of the present invention with respect to the blanket terminal passivation layer 32, the blanket terminal passivation layer 32 is typically and preferably formed a silicon nitride passivation dielectric material formed to a thickness of from about 4000 to about 7000 angstroms upon the second substrate 30. Similarly, within the preferred embodiment of the present invention with respect to the blanket underlying passivation layer 34, the blanket underlying passivation layer 34 is typically and preferably formed of a silicon oxide dielectric material typically and preferably formed to a thickness of from about 2000 to about 4000 angstroms upon the blanket terminal passivation layer 32. Similarly, within the preferred embodiment of the present invention with respect to the patterned terminal dielectric layers 36a, 36b and 36c, the patterned second intermetal dielectric (IMD) layers 40a, 40b and 40c and the patterned first inter-metal dielectric (IMD) layers 42a, 42b and 42c each of the patterned terminal dielectric layers 36a, 36b and 36c, the patterned second inter-metal dielectric (IMD) layers 40a, 40b and 40c and the patterned first inter-metal dielectric (IMD) layers 42a. 42b and 42c is typically and preferably formed as aggregates of silicon oxide dielectric materials, silicon nitride dielectric materials and spin-on dielectric materials formed over the blanket underlying passivation layer 34. Typically and preferably, the series of patterned terminal dielectric layers 36a, 36b and 36c is formed to a thickness of from about 3000 to about 6000 angstroms, the series of patterned second inter-metal dielectric (IMD) layers 40a, 40b and 40c is formed to a thickness of from about 3000 to about 6000 angstroms and the series of patterned first inter-metal dielectric (IMD) layers 42a, 42b and 42c is formed to a thickness of from about 3000 to about 6000 angstroms.

Figure 3:
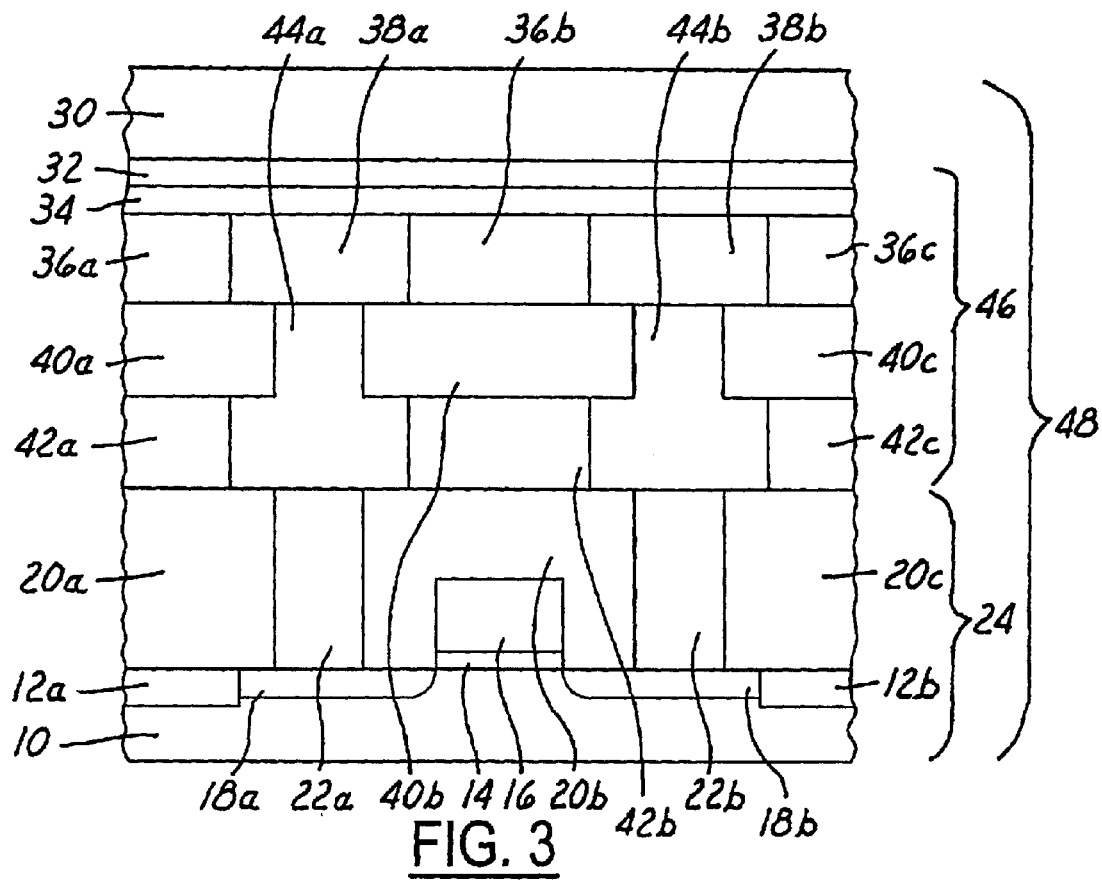

Referring now to FIG. 3, there is shown a schematic cross-sectional diagram illustrating the results of further processing of the semiconductor integrated circuit microelectronic fabrications whose schematic cross-sectional diagrams are illustrated in FIG. 1 and FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagrams are illustrated in FIG. 1 and FIG. 2, but wherein the partially fabricated semiconductor integrated circuit microelectronic fabrication 24 as illustrated within the schematic cross-sectional diagram of FIG. 1 is mated with the dielectric isolated metallization pattern 46 as illustrated within the schematic cross-sectional diagram of FIG. 2 by laminating the partially fabricated semiconductor integrated circuit microelectronic fabrication 24 with the second substrate 30 having formed thereover the dielectric isolated metallization pattern 46, to form therefrom a laminated completely fabricated semiconductor integrated circuit microelectronic fabrication 48.

Within the preferred embodiment of the present invention, the partially fabricated semiconductor integrated circuit microelectronic fabrication 24 as illustrated within the schematic cross-sectional diagram of FIG. 1 may be mated with dielectric isolated metallization pattern 46 as illustrated within the schematic cross-sectional diagram of FIG. 2 by laminating the partially fabricated semiconductor integrated circuit microelectronic fabrication 24 as illustrated within the schematic cross-sectional diagram of FIG. 1 with the second substrate 30 having formed thereover the dielectric isolated metallization pattern 46 to provide the laminated completely fabricated semiconductor integrated circuit microelectronic fabrication 48 while employing lamination methods as are generally known within the art of microelectronic fabrication and, for example and without limitation, disclosed in greater detail within the reference cited within the Description of the Related Art, the teachings of which are incorporated herein fully by reference. Such lamination methods may include, but are not limited to thermal annealing lamination methods (at a temperature of from about 400 to about 800 degrees centigrade, presuming that at least one of the pair of conductor stud layers 22a and 22b and the pair of contiguous patterned conductor interconnect and patterned conductor stud layers 44a and 44b is formed of an appropriate thermally annealable bondable conductor material) and pressure assisted lamination methods (at a pressure of from about 0.1 to about 10 atm, presuming that at least one of the pair of conductor stud layers 22a and 22b and the pair of contiguous patterned conductor interconnect and patterned conductor stud layers 44a and 44b is formed of an appropriate pressure bondable conductor material), as well as aggregate methods thereof.

Notable to the present invention is that the second substrate 30 is typically and preferably neither thinned (by, for example and without limitation, etching, milling or polishing) prior to mating the dielectric isolated metallization pattern 46 with the partially fabricated semiconductor integrated circuit microelectronic fabrication 24.

Figure 4:
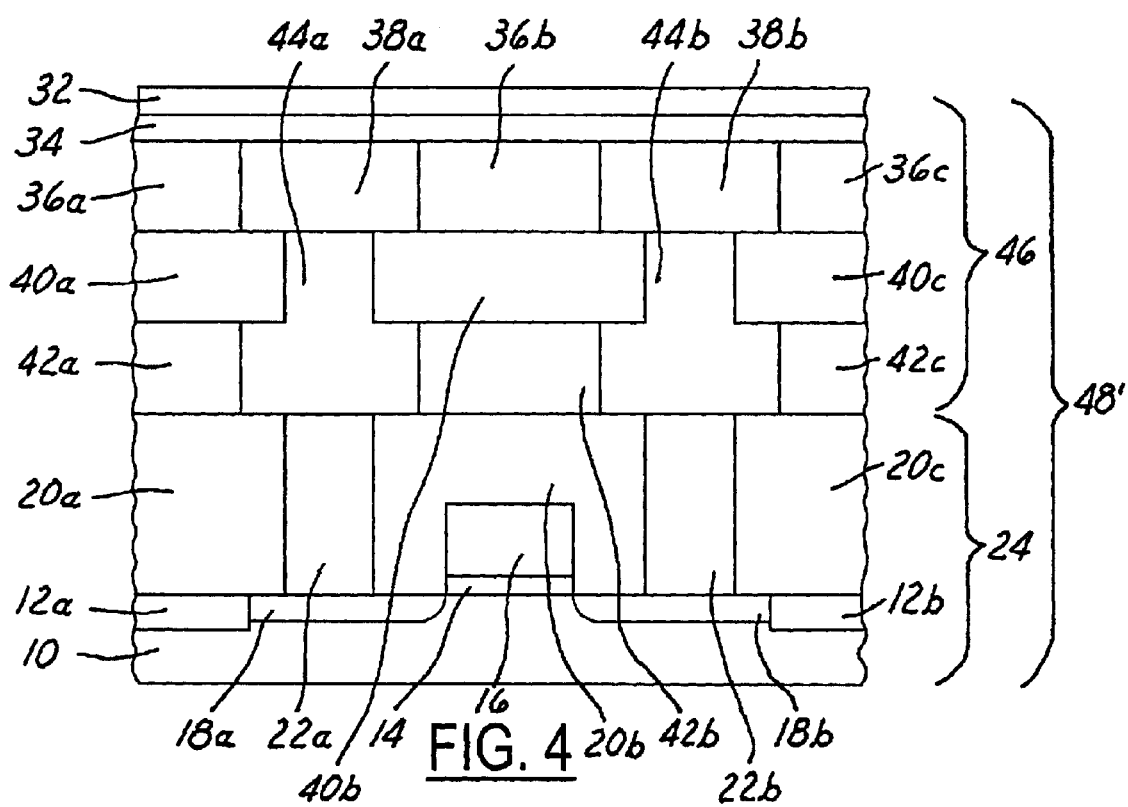

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the second substrate 30 has been removed from the laminated completely fabricated semiconductor integrated circuit microelectronic fabrication 48 to thus form from the laminated completely fabricated semiconductor integrated circuit microelectronic fabrication 48 a delaminated completely fabricated semiconductor integrated circuit microelectronic fabrication 48'.

The second substrate 30 as illustrated within the laminated completely fabricated semiconductor integrated circuit microelectronic fabrication 48 whose schematic cross-sectional is illustrated within FIG. 3 may be removed to provide therefrom the delaminated completely fabricated semiconductor integrated circuit microelectronic fabrication 48' whose schematic cross-sectional diagram is illustrated in FIG. 4, while employing any of several removal methods, including but not limited to mechanical removal methods, chemical etch removal methods and chemical mechanical polish (CMP) planarizing removal methods.

Within the preferred embodiment of the present invention, the second substrate 30 is typically and preferably removed from the laminated completely fabricated semiconductor integrated circuit microelectronic fabrication 48 whose schematic cross-sectional diagram is illustrated in FIG. 3 to provide the delaminated completely fabricated semiconductor integrated circuit microelectronic fabrication 48' whose schematic cross-sectional diagram is illustrated in FIG. 4 while employing a chemical mechanical polish (CMP) planarizing removal method which employs the blanket terminal passivation layer 32, particularly when formed of a silicon nitride passivation dielectric material, as a chemical mechanical polish (CMP) stop layer.

Upon forming the semiconductor integrated circuit microelectronic fabrication whose schematic cross-sectional diagram is illustrated in FIG. 4, there is formed a semiconductor integrated circuit microelectronic fabrication in accord with the preferred embodiment of the present invention. The semiconductor integrated circuit microelectronic fabrication so formed is fabricated with enhanced efficiency insofar as the semiconductor integrated circuit microelectronic fabrication is formed employing a lamination method which employs lamination of at least two separate substrates which may be fabricated in parallel.

As is understood by a person skilled in the art, the preferred embodiment of the present invention is illustrative of the present invention rather than limiting of the present invention. Revisions and modifications may be made to methods, materials, structures and dimensions through which is fabricated a semiconductor integrated circuit microelectronic fabrication in accord with the preferred embodiment of the present invention while still fabricating a semiconductor integrated circuit microelectronic fabrication in accord with the present invention, further in accord with the accompanying claims.

What is claimed is:

1. A method for fabricating a semiconductor integrated circuit microelectronic fabrication comprising:

providing a first semiconductor substrate;

forming over the first semiconductor substrate at least one microelectronic device to form from the first semiconductor substrate a partially fabricated semiconductor integrated circuit microelectronic fabrication;

providing a second substrate;

forming over the second substrate, in inverted order, a dielectric isolated metallization pattern intended to mate with the partially fabricated semiconductor integrated circuit microelectronic fabrication;

laminating the partially fabricated semiconductor integrated circuit microelectronic fabrication with the second substrate to mate the partially fabricated semiconductor integrated circuit microelectronic fabrication with the dielectric isolated metallization pattern to thus form a laminated completely fabricated semiconductor integrated circuit microelectronic fabrication; and removing the second substrate from the laminated completely fabricated semiconductor integrated circuit microelectronic fabrication while employing a removal method selected from the group consisting of milling methods, polish methods and chemical mechanical polish (CMP) planarizing methods, where the removal method employs the dielectric isolated metallization pattern as a stop layer.

2. The method of claim 1 wherein the microelectronic device is selected from the group consisting of resistors, transistors, diodes and capacitors.

3. The method of claim 1 wherein the second substrate is selected from the group consisting of conductor substrates, semiconductor substrates, dielectric substrates and aggregates thereof.

4. The method of claim 1 wherein the second substrate is a second semiconductor substrate.

5. The method of claim 1 wherein the first semiconductor substrate is thicker then the second substrate.

6. The method of claim 1 wherein the dielectric isolated metallization pattern comprises a plurality of laminated patterned conductor layers.

7. The method of claim 6 wherein each laminated patterned conductor layer within the plurality of laminated patterned conductor layers is formed to a thickness of from about 3000 to about 6000 angstroms.

8. The method of claim 1 wherein the mating of the partially fabricated semiconductor integrated circuit microelectronic fabrication with the dielectric isolated metallization pattern formed over the second substrate is undertaken while employing a laminating method selected from the group consisting of thermally assisted laminating methods and pressure assisted laminating methods.

9. The method of claim 1 wherein the semiconductor substrate is not thinned after forming thereover the minimum of one microelectronic device.

10. The method of claim 1 wherein the second substrate is not removed from the dielectric isolated metallization pattern prior to matins the partially fabricated semiconductor integrated circuit microelectronic fabrication with the dielectric isolated metallization pattern.

* * * * *